(12) United States Patent
Bar-Or et al.

(10) Patent No.: US 8,001,316 B2
(45) Date of Patent: Aug. 16, 2011

(54) CONTROLLER FOR ONE TYPE OF NAND FLASH MEMORY FOR EMULATING ANOTHER TYPE OF NAND FLASH MEMORY

(75) Inventors: Shahar Bar-Or, Raanana (IL); Alon Marcu, Tel Mond (IL); Ori Stern, Mode'en (IL); Dan Inbar, Yehud (IL)

(73) Assignee: SanDisk IL Ltd., Kfar Saba (IL)

( * ) Notice: Subject to any disclaimer, the term of this patent is extended or adjusted under 35 U.S.C. 154(b) by 347 days.

(21) Appl. No.: 11/964,741

(22) Filed: Dec. 27, 2007

(65) Prior Publication Data
US 2009/0172247 A1    Jul. 2, 2009

(51) Int. Cl.
*G06F 12/12* (2006.01)
(52) U.S. Cl. .................................. 711/103; 711/155
(58) Field of Classification Search .................... None
See application file for complete search history.

(56) References Cited

U.S. PATENT DOCUMENTS

| | | | |
|---|---|---|---|
| 5,541,886 A | 7/1996 | Hasbun | 365/230.01 |
| 5,930,167 A | 7/1999 | Lee et al. | 365/185.03 |
| 6,426,893 B1 | 7/2002 | Conley et al. | |
| 7,164,601 B2 | 1/2007 | Mitani et al. | |
| 7,218,551 B2 | 5/2007 | Roohparvar | |
| 2005/0057995 A1* | 3/2005 | Mitani et al. | 365/222 |
| 2006/0184722 A1* | 8/2006 | Sinclair | 711/103 |
| 2007/0061502 A1 | 3/2007 | Lasser et al. | |
| 2007/0133249 A1 | 6/2007 | Roohparvar | |
| 2007/0234183 A1 | 10/2007 | Hwang et al. | 714/763 |
| 2008/0250195 A1* | 10/2008 | Chow et al. | 711/103 |

* cited by examiner

*Primary Examiner* — Than Nguyen
(74) *Attorney, Agent, or Firm* — Martine Penilla & Gencarella, LLP

(57) ABSTRACT

A controller for one type of NAND flash memory device that emulates another type of NAND flash memory device. The controller may include a host NAND interface to receive host data from a NAND host device, and a data aggregator for aggregating the host data with complementary data, to thereby create device data that is storable in a device page of an array of NAND flash memory cells of the NAND flash memory device. After creating the device data the controller writes the device data into a device page of the NAND flash memory cells. The controller also includes a data parser to parse host data from device data when data read operations are executed by the controller. If required, the controller uses the data parser to parse complementary data from device data to create device data when data writing operations are executed by the controller.

19 Claims, 3 Drawing Sheets

CONTROLLER FOR ONE TYPE OF NAND FLASH MEMORY FOR EMULATING ANOTHER TYPE OF NAND FLASH MEMORY

FIELD OF THE DISCLOSURE

The present disclosure relates generally to flash memory devices and more specifically to emulating one type of a NAND flash memory device (e.g., a Single Bit per Cell ("SBC") flash memory device) by another type of NAND flash memory device (e.g., a Multiple Bit per Cell ("MBC") flash memory device).

BACKGROUND

Flash memory devices, a type of non-volatile memory devices, have been known for many years. A flash memory device includes an array of memory cells, where each memory cell is implemented by a semiconductor transistor that typically has a floating gate region, a drain region, and a source region. A memory cell can have two or more distinct states which are implemented by controlling the amount of charge stored within the floating gate. That is, each state is associated with a different amount of charge that is stored within the floating gate. To actually use a memory cell, each state thereof is associated with a binary value.

One type of flash memory device is based on a technology commonly known as "Single Bit per Cell" (SBC), which means that each memory cell in an SBC memory device stores one bit. Storing one bit per cell means that the cell is configured to be in (i.e., to store) one of two possible states. Typically, one state of the cell is associated with zero charge being stored in the cell's floating gate. This state is the "unwritten" state of the cell and, usually, it represents the binary digit "1". The cell's other state typically is associated with some amount of negative charge in the floating gate. This state is the "written" state of the cell and, usually, it represents the binary digit "0". The existence of negative charge in the floating gate results in an increase in the threshold voltage of the cell's transistor and, consequently, in the voltage that has to be applied to the transistors control gate in order to cause the transistor to conduct.

Flash memory devices are capable of performing three operations: writing (often called "programming" for historical reasons) data into memory cells, reading data from memory cells, and erasing data from memory cells. These operations are initiated by an external host device but handled locally by a controller. Writing a binary digit (i.e., "0" or "1") into a memory cell involves changing the charge in the transistor's floating gate to thereby change the threshold voltage of the cell. Reading a binary digit stored in a memory cell involves checking the level of the threshold voltage of the cell—if the threshold voltage is in the higher state, then the bit value is interpreted as logical value "0". If, however, the threshold voltage is in the lower state, then the bit value is interpreted as logical value "1". Actually, there is no need to accurately read the cell's threshold voltage. Instead, it is adequate to correctly identify which of the two states the cell is currently in. To accomplish that, the threshold voltage of the cell has to be compared to a reference voltage whose value is between the two states, and to determine if the cell's threshold voltage is either below or above the reference value.

For many types of flash memories, for example NAND flash memories, writing and erasing operations cannot be done on individual memory cells but, rather, they are done on groups of memory cells. Writing operations are done on "pages", which are relatively small (typically 512 bytes, 2 Kbytes, or 4 Kbytes for a NAND flash memory device), whereas erasing operations are done on "blocks", which are larger than pages (typically 32 Kbytes or 128 Kbytes for a NAND flash memory device).

Another type of flash memory devices is based on a technology commonly known as "Multi Bit per Cell" (MBC). In an MBC memory device each memory cell stores N bits ($N \geq 2$), which means that an MBC memory cell is configured to store $2^N$ states. For example a memory cell that stores 2 bits stores four states, each of which is associated with one of the four binary values "00", "01", "10", and "11".

As a cell's state is represented by a threshold voltage of the cell, an MBC cell storing two bits supports four distinct ranges of the cell's threshold voltage. As for the SBC cell, each state of an MBC cell is actually a voltage range and not a single voltage. When reading the cell's content (i.e., the stored binary value), the cell's threshold voltage must be correctly associated with the correct voltage range. An MBC flash device is discussed, for example, in U.S. Pat. No. 5,434,825 to Harari.

When the concept of flash memory technologies was first conceived, MBC NAND flash devices were relatively rare and SBC devices were the norm. Therefore, traditional designs of hosts that utilize flash memory technologies are SBC-oriented, which render them incompatible with MBC devices. Therefore, even though the MBC NAND technology has matured, is more cost effective than SBC devices (at least in terms of megabytes per dollar) and is already available in the market, MBC-based NAND devices cannot be used by SBC-compliant host devices, which impedes further proliferation of the MBC technology even though MBC devices offer more storage capacity per same physical area than SBC devices. Even if memory cells, which store data using the same number of bits-per-cell are involved, other technical mismatches may exist if storage devices are supplied by different storage vendors because there is no standard for NAND interfaces and different vendors may and do use different kinds of NAND interfaces.

Overcoming this compatibility problem (i.e., making MBC flash devices and SBC-compliant hosts able to interact with each other) is not trivial because SBC devices and MBC devices inherently differ in several technical aspects. For example, SBC devices and MBC devices utilize data pages and data blocks of different sizes. In addition, because the voltage spacing (an "error margin") between the two states of an SBC cell is larger than the error margin existing between each two adjacent states of an MBC, an SBC cell offers a higher level of reliability, for which reason SBC cells are usually used for booting computer systems. To compensate for their relatively lower reliability, MBC devices use stronger error correction schemes, for example a stronger Error Correction Code (ECC).

As SBC flash memory devices offer higher reliability and faster responsiveness, efforts have been made to combine SBC capabilities with MBC's. However, those efforts are directed towards improving only specific technical aspects of the MBC flash memory device. Some prior art addresses the booting aspect; i.e., they offer storing an initialization (i.e., booting) program in a specific area in an MBC flash memory device to obtain booting reliability that is similar to the reliability offered by "genuine" SBC technology. Other prior art addresses the reliability aspect and provides a stronger error correction mechanism. Other prior art address the responsiveness speed aspect and permit dedicating and using SLC caching in the MBC device, and so on. However, the prior art does not teach writing SBC data into an MBC flash memory device as regular MBC data, or reading SBC data from within MBC data.

SUMMARY

The following example embodiments and aspects thereof are described and illustrated in conjunction with systems, tools, and methods, which are meant to be exemplary and illustrative but not limiting in scope.

As part of the present disclosure a method for writing host data into a flash memory device is provided, the method including receiving, by a controller of the flash memory device, from a host device a write instruction to write host data into an array of NAND flash memory cells which are grouped into separately-writable device pages. The controller may aggregate the host data with complementary data, to thereby create device data that is storable in one or more of the device pages, and then write the device data into the one or more of the device pages.

As part of the present disclosure a method for reading host data from a flash memory device is provided, the method including the steps of receiving from the host device a read instruction to read host data from the array of NAND flash memory cells which are grouped into separately-readable device pages, the host data being a portion of device data that is stored in a device page; parsing the host data from the device data, and sending the parsed host data to the host device.

As part of the present disclosure a method for executing an erasing instruction to erase host data from a flash memory device is provided, the method including the steps of receiving from a host device an erase instruction to erase host data from an array of NAND flash memory cells grouped into separately-erasable device blocks, the host data being a portion of device data that is stored in a device block; marking the host data as erased, and sending a message to the host device that the host data has been erased. The method may further include a step of actually erasing the device block containing the host data.

As part of the present disclosure a controller for a flash memory device is provided, which implements the writing, reading, and erasing methods. The controller may include a host NAND interface to receive host data from a NAND host device, and a data aggregator for aggregating the host data with complementary data, to thereby create device data. The controller may write the device data into a device page of an array of NAND flash memory cells associated with the flash memory device. The controller also includes a data parser to parse the complementary data when data writing operations are executed by the controller, and to parse host data from device data when data read operations are executed by the controller.

The host data may be formatted for a NAND array of memory cells that stores data in M bits per cell, and the NAND flash memory cells may be designed to store data in N bits per cell, wherein N and M are integers and N is greater than M. In one example embodiment N equals 2 and M equals 1. In another example embodiment N equals 4 and M equals 1. In yet another example embodiment N equals 4 and M equals 2.

In addition to the exemplary aspects and embodiments described above, further aspects and embodiments will become apparent by reference to the figures and by study of the following detailed description.

BRIEF DESCRIPTION OF THE DRAWINGS

Exemplary embodiments are illustrated in referenced figures. It is intended that the example embodiments disclosed herein are illustrative rather than restrictive. The disclosure, however, may better be understood with reference to the following detailed description when read with the accompanying figures, in which.

Figure 1:
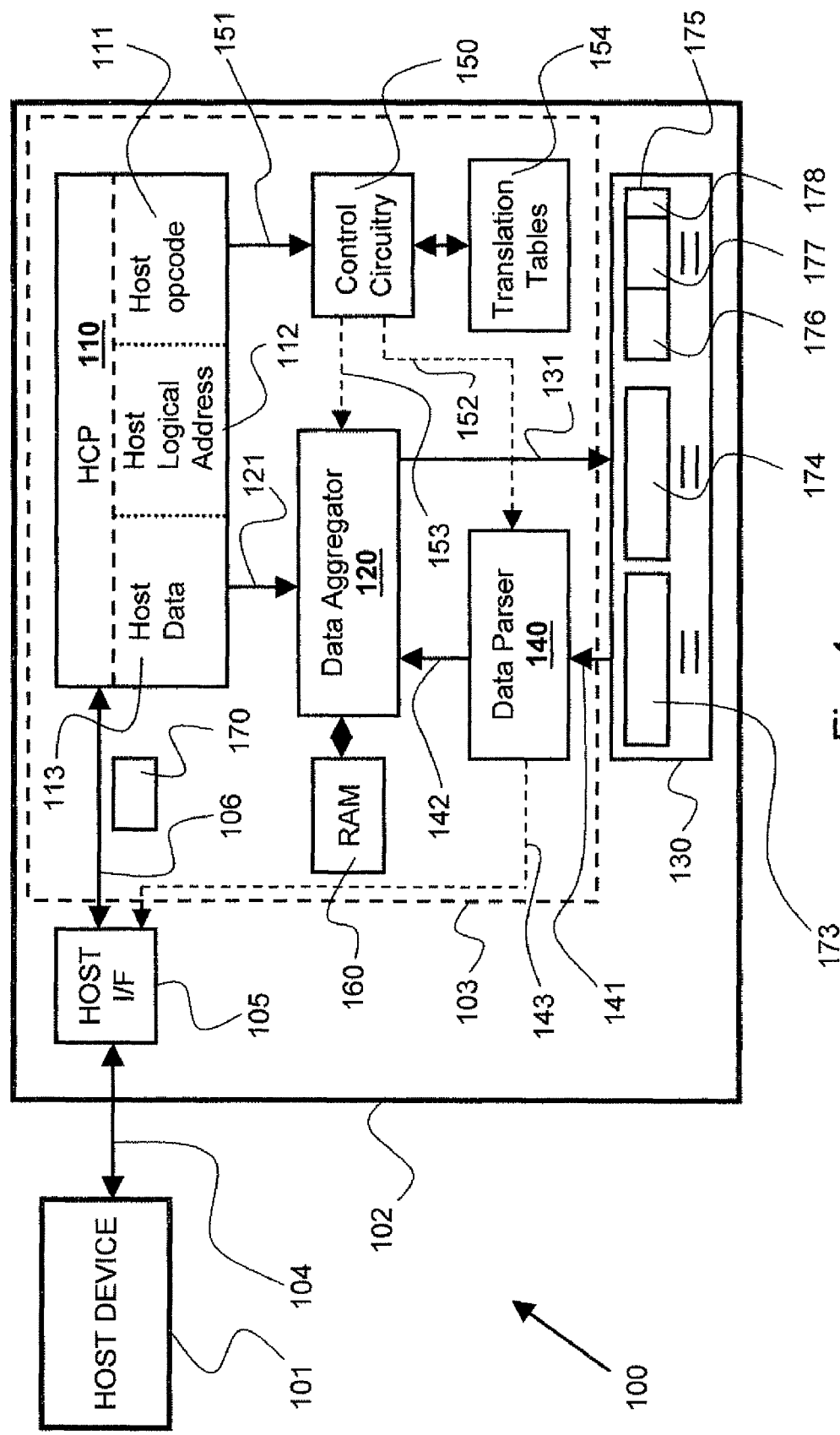
FIG. 1 schematically illustrates a flash memory device according to one example embodiment of the present disclosure.

It will be appreciated that for simplicity and clarity of illustration, elements shown in the figures are not necessarily drawn to scale. Further, where considered appropriate, reference numerals may be repeated among the figures to indicate like, corresponding or analogous elements.

DETAILED DESCRIPTION

The claims below will be better understood by referring to the present detailed description of example embodiments of the invention. This description is not intended to limit the scope of the claims but instead to provide examples.

As discussed above, NAND flash memory devices are designed to store data in separately-handled pages. Depending on the type of operation initiated by the host device (i.e., writing host data into the flash memory device, reading host data from the flash memory device, or erasing host data from the flash memory device), "separately-handled pages" can refer to pages that are "separately-writable", or "separately-readable". When an "erase" operation is involved, data are erased in blocks, where each block consists of several pages. The size of a "page" and the size of a block depend on the type of NAND flash memory device, and, as discussed above, handling data pages of various sizes by the same flash memory device is not trivial, because, typically, NAND flash memory devices are designed, or at least optimized, for a specific page and block size. As a result of this, a host device that is designed for a certain page size usually cannot interact, at least not efficiently, with flash memory devices that are designed for a different page size.

In general, a "command sequence" originating from a host device may include data (referred to hereinafter as "host data"), a logical page address associated with a physical page within the flash memory device, and a write instruction for the flash memory device to write the host data into the physical page using the logical address. Mapping from a host logical address to a physical address of a device page is performed by mapping the host logical address to a logical address of a corresponding device page, and, then, mapping the logical address of the device page to a physical address of the device page. A "command sequence" may alternatively include a logical address and a read instruction for the flash memory device to read host data from a physical page of the flash memory device using the logical address, or a logical address and an erase instruction to erase host data from the flash memory device using the logical address. A "command sequence" may also include management data and other types of data or information, which can be used by the flash memory device. A command sequence which is forwarded from a host device to a flash memory device is hereinafter referred to as a "host command sequence". Because in NAND flash devices data is grouped into pages, it may be said that "host data" is grouped into a "host page".

FIG. 1 shows a flash memory device (shown at 102) according to one example embodiment of the present disclosure. NAND flash memory system 100 includes a NAND host device 101 and a NAND flash memory device 102, which interfaces with host device 101. Flash memory device 102 includes a host interface (I/F) 105, controller 103, and an array of NAND memory cells 130 for storing data in N bits per cell, where N equals or is greater than 2.

Host device 101 forwards (shown at 104) to flash memory device 102, via HOST I/F 105, a host command sequence. The host command sequence includes host data, which is grouped into a host-sized page that is smaller than the size of a device page, for storing in flash memory device 102. If, for example, host device 101 is an SBC device that is designed to interacts with SBC flash memory devices, the host data has the size, and other characteristics, of SBC data and, likewise, the host command sequence is or resembles an SBC command sequence. The size of an SBC page typically is less than 4 Kbytes (e.g., 2 Kbytes).

Data storable in memory cell array 130 is hereinafter referred to as "device data", whereas the group of memory cells, within memory cell array 130, used to store a device data is referred to herein as a "device page". A device page has associated with it both a physical address, which indicates the page's relative location within memory cell array 130, and a logical address that indicates the relative location of the page as perceived by host device 101. Typically, translation tables are used to translate one type of address into the other.

If, for example, the flash memory device is an MBC device, then a device page has the size, and other characteristics, of an MBC page and, likewise, the device command sequence, which is a command sequence usable internally by controller 103, is structured or formatted so as to conform to the MBC technology. The size of an MBC page typically is at least 4 Kbytes. It is noted that, in the context of the present disclosure, host data is smaller than device data regardless of the involved technologies (e.g., SBC, MBC, and so on).

Flash memory devices typically include an integral flash controller (not shown in FIG. 1) for managing data exchange between the memory device and its host device and various internal processes (e.g. wear leveling). If a flash memory device and its host device operate using the same page size and the same block size, the flash memory device can interact with its host device without using a controller such as controller 103 of FIG. 1. However, the present disclosure applies to host device 101 and flash memory device 102 that conform to different technologies (e.g., SBC vs. MBC), and also to a host device and a flash memory device that are based on the same technology (e.g., MBC) but use incompatible NAND interfaces. As discussed above, host device 101 may conform to the SBC technology and flash memory device 102 may conform to the MBC technology. Controller 103 resolves the technical discrepancies between host 101 and flash memory device 102 in the way described below.

Controller 103 includes a host command parser ("HCP") 110, a control circuitry 150, a data aggregator 120, and a data parser 140. HCP 110 is connected (shown at 106) to HOST I/F 105, data aggregator 120 (shown at 121), and control circuitry 150 (shown at 151). Data aggregator 120 may be connected to a random access memory ("RAM") such as RAM 160, to temporarily store host data, and possibly other data (e.g., dummy data). Data aggregator 120 is connected (shown at 142) to data parser 140. Data aggregator 120 and data parser 140 are connected to NAND memory cell array 130 (shown at 131 and 141, respectively). "Dummy data" refers to particular data that is identifiable by controller 103 as data that does not have any meaning other than representing an empty space within a device page, and is inaccessible to external devices such as host device 101.

Controller 103 is adapted or configured to receive from host device 101, via HOST I/F 105, a host command sequence (e.g., an SBC command sequence) to handle host data, which may be SBC data. Host command parser (HCP) 110 is adapted or configured to generate from the host command sequence a device command sequence to handle the host data in compliance with a device page operation (e.g., an MBC operation), that is applicable to memory cell array 130. "Handling host data" refers herein to a situation where the host command sequence may actually include host data for storing in (writing or programming into) the flash memory device, or the host data is already stored in the flash memory device and needs to be read or erased from memory cell array 130.

Host command parser (HCP) 110 generates the device command sequence by parsing the host command sequence into host opcode ("HOC") 111, host logical address ("HLA") 112 and host data 113, translating (if required) an opcode usable by the flash memory device 102. The data (i.e., host data) parsed from the host command sequence is processed as described below. "Host data" may refer to data, metadata, and/or management data which are associated with the data to be handled (i.e., written, read, or erased).

Alternative embodiments may include more, less, other, or functionally equivalent modules, components, or elements. For example, conventional flash memory devices include a flash manager, i.e., a type of controller that manages ingress and egress data and other internal processes, such as wear-leveling, translation of logical address into physical addresses and vice versa. Therefore, controller 103 of FIG. 1 can either be a separate device that interacts with a flash manager, or the functionalities of a flash manager can be integrated, embedded, or affiliated, into controller 103. Although shown in FIG. 1 as a separate component, host interface 105 can be an integral part of controller 103. Although shown in FIG. 1 as being an integral part of controller 103, RAM 160 or translation tables 154, or both, can reside external to controller 103.

"WRITE" Operation

If, after checking the host opcode 111, HCP 110 determines that the host command sequence includes a write instruction to write host data in memory cell array 130, then, if the write instruction is not memory device compatible, HCP 110 translates the host's write command into a write instruction that is usable by flash memory device 102. Otherwise (i.e., no instruction translation is required), control circuitry 150 can utilize the host write instruction as is. Accordingly, HCP 110 forwards (shown at 151) the original write instruction, or (i.e., if it is not usable by flash memory device 102), a translation thereof, to control circuitry 150. Control circuitry 150 may then control the operation of data aggregator 120 (shown at 153) and, if required, also of data parser 140 (shown at 152), to comply with the write instruction issued by the host device.

Reference numeral 170 designates exemplary host data that is received from host device 101 within a received host command sequence. If opcode 111 is a write instruction, this means that controller 103 has to write host data 170 in memory cell array 130. In such cases, HCP 110 forwards (shown at 121) host data 170, which is exemplary host data 113, to data aggregator 120 for processing.

Reference numerals 173, 174, and 175 designate exemplary device pages into which only device data having the same size (e.g., 4 KB) as a device page can be written, or from which data having the same size as the device page can be read. For the sake of simplicity, FIG. 1 shows only three exemplary device pages (i.e., device pages 173, 174, and 175), while memory cell array 130 would actually have a large number of device pages. Because host data 170 is smaller than a device page (e.g., device page 175), and because of the various technical intricacies associated with each page size, host data 170 cannot be written into memory cell array 130 as is but, rather, it has to be processed by controller 103 before controller 103 writes it into memory cell array 130.

To write host data 170 (or any other host data for that matter) into memory cell array 130, controller 103 includes a data aggregator 120 that is adapted or configured to create device data that is storable in one or more device pages in memory cell array 130, for example in device page 175. Data aggregator 120 creates the device data by aggregating host data 170 with complementary data. After completing the data aggregation process data aggregator 120 writes (shown at 131) the newly created device data into one or more of the device pages 173, 174, and 175, for example.

Data aggregator 120 can aggregate host data with the complementary data using various options. According to a first option, the complementary data is other host data that are received from the host device 101 and queued in the flash memory device 102. This option involves waiting until a sufficient number of new host data are received from host device 101 and queued, for example in Random Access Memory (RAM) 160.

In the event that an insufficient number of host data are queued in flash memory device 102, a second option may be employed, which involves reading the remaining complementary data from memory cell array 130. In order to facilitate the second option, control circuitry 150 sends (shown at 152) to data parser 140 as many physical addresses of device pages 173, 174 and 175, as required, from which data parser 140 can read the remaining complementary data (It is possible to employ this second option even absent the situation in which an insufficient number of host data are queued in flash memory device 102). Data parser 140 reads data from memory cell array 130 by using a physical address to retrieve the corresponding device data from the addressed device page. If the data to be read is host data, data parser 140 parses the host data from the device data.

A third option involves retrieving the complementary data from memory cell array 130 only if no new host data arrive for a specified period of time. A fourth option involves temporarily storing currently received host data in some device page (i.e., in device page 173, 174, 175, or in any other device page) in memory cell array 130, and aggregating it with complimentary data later, after receiving additional host data.

With regard to the physical addresses of device pages, if control circuitry 150 finds, for example by using translation tables 154, that the potential complementary data are stored in one particular device page, control circuitry 150 may send (shown at 152) to data parser 140 only the physical address of that particular device page (e.g., device page 175). If, however, control circuitry 150 finds that the potential complementary data are distributed among several device pages within memory cell array 130, control circuitry 150 sends (shown at 152) to data parser 140 several physical addresses that respectively correspond to the several device pages.

Then, data parser 140 utilizes the physical addresses sent from control circuitry 150 to retrieve (shown at 141) device data from memory cell array 130, from which data parser 140 can parse the required complementary data. Then, data parser 140 may forward (shown at 142) the complementary data to data aggregator 120, which aggregates them with the host data to thereby create a new device data. Then, data aggregator 120 writes (shown at 131) the device data into the target device page (e.g., device page 175) whose physical address was sent (shown at 153) from control circuitry 150, to thereby complete the "write" instruction 111. It is noted that the complimentary data can be dummy data, as discussed below in connection with FIG. 3. That is, host data to be stored in a device page can be aggregated with dummy data and the device page will be regarded by controller 103 as containing only the host data. By way of example device page 175 is shown containing host data 176, host data 177, and dummy data 178. In this example data aggregator 120 received host data 176 and decided to wait for additional host data 177 before writing both host data 176 and host data 177 into flash memory cell array 130. While waiting for the additional host data (i.e., host data 177), data aggregator 120 temporarily kept host data 176 in RAM 160. Then, data aggregator 120 received host data 177 and aggregated host data 176 with host data 177 and with dummy data 178. Finally, data aggregator 120 wrote the resulting aggregated data into device page 175, as depicted in FIG. 1.

It is noted that instead of sending physical addresses of device pages to data parser 140 (as shown at 152) and to data aggregator 120 (as shown at 153), control circuitry 150 may use the physical addresses of device pages to read the device data of interest from memory cell array 130, and to send it to data parser 140 or to data aggregator 120, as the case may be.

"READ" Operation

If a received opcode 111 is interpreted by control circuitry 150 as a "READ" instruction, control circuitry 150 executes a "READ" instruction during which control circuitry 150 translates host logical address 112 into a physical address of a device page (hereinafter referred to as a "requested device page") within memory cell array 130, from which host data (hereinafter referred to as "the requested host data") should be read. Because host data are stored in device pages as a portion of device data, the requested host data (i.e., the host data to be read) has to be parsed from the device data stored in the involved device page. Therefore, control circuitry 150 forwards (shown at 152) the physical address of the requested device page to data parser 140. Data parser 140 then utilizes the physical address of the requested device page to read (shown at 141) the requested device data. Then, data parser 140 parses the requested host data from the retrieved device data, and sends (shown at 143) the requested host data, via HOST I/F 105, to host device 101, to thereby complete the "READ" command 111.

It is noted that instead of sending the physical address of the requested device page to data parser 140 (as shown at 152), control circuitry 150 may use the physical addresses of the requested device page to fetch and to send the requested device data to data parser 140.

"ERASE" Operation

If a received opcode 111 is interpreted by control circuitry 150 as an "erase" instruction, control circuitry 150 executes an "erase" instruction. Unlike "writing" and "reading" operations, which are executed on "pages", data is erased in NAND flash devices in "blocks". A "host block" consists of multiple host pages, and a "device block" consists of multiple device pages. Therefore, if control circuitry 150 identifies an erase instruction to erase host data, control circuitry 150 consults translation tables 154 for the address of the device block in memory cell array 130 that stores the device data that includes the host data that is to be erased. Then, control circuitry 150 marks the host data, in translation tables 154, as erased, and sends a message to host device 101 that the host data has been erased. Control circuitry 150 may actually erase the host data from memory cell array 130 later, at a proper time or when it is convenient. In order to actually erase the host data, control circuitry 150 translates the host logical address 112 associated with the host data into the corresponding physical address of the device block that contains the host data and, then, control circuitry 154 erases that device block.

Figure 2:
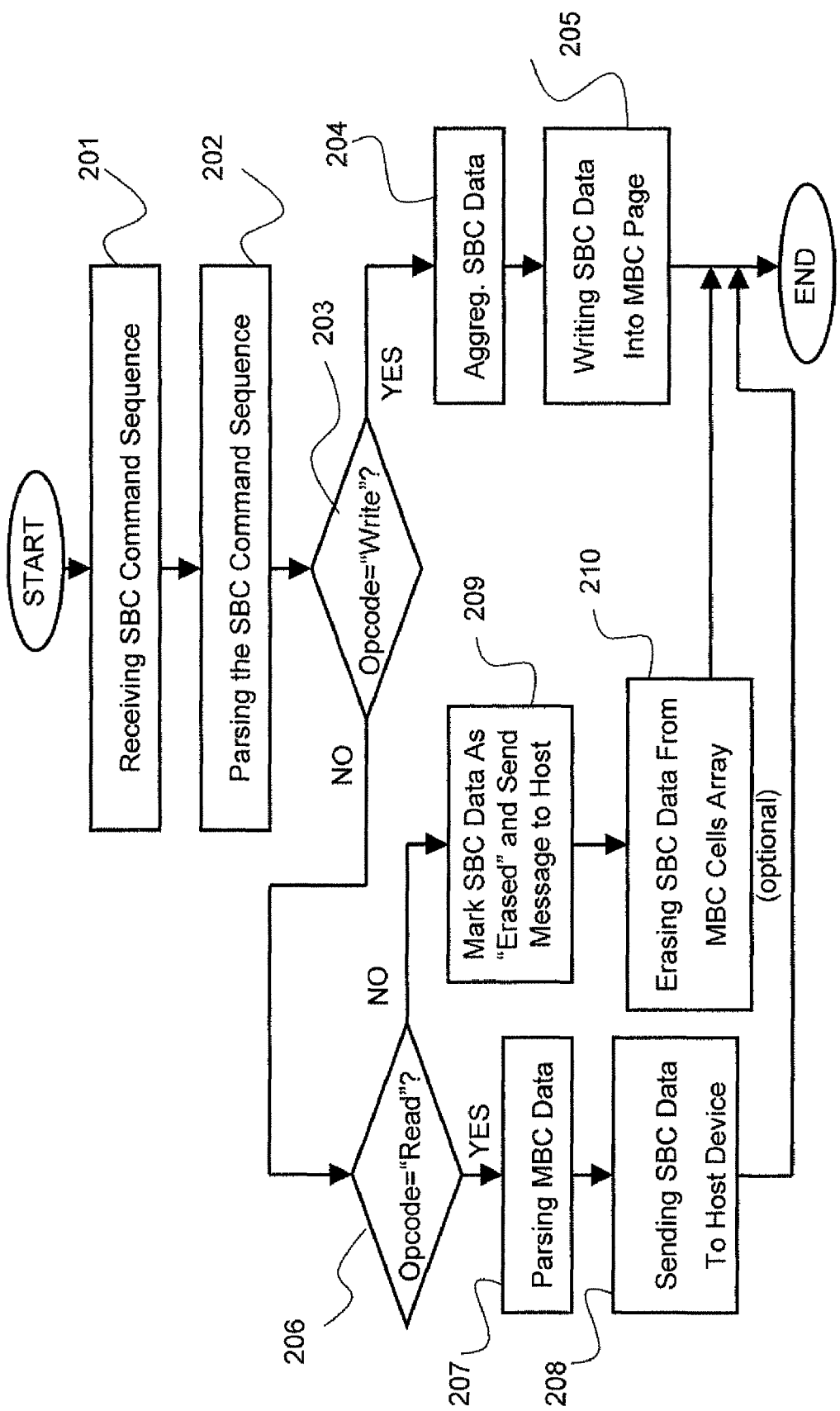
FIG. 2 shows an exemplary method for handling a host command sequence by a flash memory device according to one example embodiment of the present disclosure.

FIG. 2 shows an exemplary method for handling a host command sequence by a flash memory device according to the present disclosure. FIG. 2 will be described in association with FIG. 1, and assuming that host device 101 conforms to SBC technology and flash memory device 102 conforms to MBC technology. As explained above, an SBC host device and an MBC flash memory device cannot interact without attending to the various technical aspects that differentiate one device from the other. In addition to the differentiating page size and block size, an entire page is erased in an SBC flash memory device before new data is written into that page. Nevertheless, the "erasing" step is spared if the new data can be written into a sufficiently large free space in that page, a feature that is commonly referred to in the art as Partial Page Programming ("PPP"). As opposed to SBC flash memory devices, MBC flash memory devices always erase an entire page before new data can be written into that page. In addition, SBC flash memory devices write data into pages randomly, whereas MBC flash memory devices write data into pages sequentially; i.e., data are written into page 0, then into page 1, page 2, etc. As explained above in connection with FIG. 1, controller 103 resolves these technical differences by using host command parser 110, data aggregator 120, and data parser 140.

At step 201 controller 103 of NAND flash memory device 102 receives (shown at 104 in FIG. 1) from host device 101 a host command sequence which, in this example, is an SBC command sequence. At step 202 host command parser (HCP) 110 parses the SBC command sequence to an SBC opcode 111, SBC logical address 112, and host data 113, which, in this example, is SBC data. At step 203 it is checked whether the opcode is a "write" instruction. If the SBC opcode is a "write" instruction (shown as "YES" at 203), then at step 204 control circuitry 150 instructs (shown at 153) data aggregator 120 to aggregate or merge, the SBC data 113 with complimentary data, which may be other SBC data, to thereby create device data (which in this example is MBC data) that is storable in one or more device pages of MBC cell array 130. At step 205 the SBC data is written into the corresponding MBC page(s) as a result of the control circuitry 150 instructing (shown at 153) data aggregator 120 to write the created device data (i.e., the MBC data), which includes the SBC data, into the device page(s) of MBC cell array 130.

The complementary data may be other host data that was received from the host device 101 and queued in the flash memory device 102. The complementary data may be host data that is already stored in the NAND flash memory cell array 130 as a portion of other device data and parsed therefrom. The complementary data may be dummy data. Regarding writing operations, the device pages of memory cell array 130 are grouped into blocks and logically-wise written to successively within each block, such that the physical addresses of these device pages are not necessarily sequential. In other words, data may be written into non-contiguous, sporadic, or irregularly placed, device pages and the data stored in the non-contiguous, sporadic, or irregularly placed, device pages will logically be introduced to the host device as if they were stored in contiguous device pages.

The host data may be written by controller 103 into the flash memory cell array 130 using a pseudo partial page programming ("PPP") scheme responsive to the host device 101 writing, or attempting to write, host data using a PPP scheme. Using the pseudo PPP scheme may include using dummy data as the complementary data. The host data may be written by controller 103 in a device page that is not adjacent to an already written-to device page, e.g., to improve power failure protection.

If, however, the SBC opcode 111 is not a "write" instruction (shown as "NO" at step 203), then at step 204 it is checked whether the opcode is a "read" instruction. If the SBC opcode is a "read" instruction (shown as "YES" at step 206) to read SBC data from memory cell array 130, the SBC data being a portion of MBC data that is stored in a device page, then at step 207 control circuitry 150 instructs (shown at 152) data parser 140 to read (shown at 141) the MBC data from memory cell array 130, and to parse the SBC data from the MBC data. At step 208 control circuitry 150 instructs (shown at 152) data parser 140 to send the parsed SBC data to host device 101, to thereby complete the read operation.

If, however, the SBC opcode 111 is not a "read" instruction (shown as "NO" at 206), the opcode 111 is an "erase" instruction to erase SBC data from memory cell array 130, the SBC data being a portion of MBC data that is stored in a device block. At step 209 controller 103 internally (e.g., in translation tables 154) marks the SBC data as erased and sends a message to host device 101 that the SBC data has been erased. At optional step 210 controller 103 actually erases the SBC data from the MBC block containing the SBC data, after it uses the logical address 112 to identify the corresponding physical address of the MBC block.

It is noted that by using a controller such as controller 103 of FIG. 1, an SBC host device can work with (i.e., issue "write", "read" and "erase" instructions to) an MBC flash memory device as though the MBC flash memory device were an SBC flash memory device. It is also noted that the present disclosure is not limited to a NAND SBC host device operating with a NAND MBC flash memory device. The present disclosure is also applicable to any NAND host device and NAND flash memory device, provided that host data are grouped into host pages that are smaller than the device pages. For example, the present disclosure is applicable to an MBC host device operating with an MBC flash memory device if the data page associated with the MBC host device is smaller than the data page associated with the MBC flash memory device.

Emulating SBC Partial Page Programming ("PPP")

Figure 3:
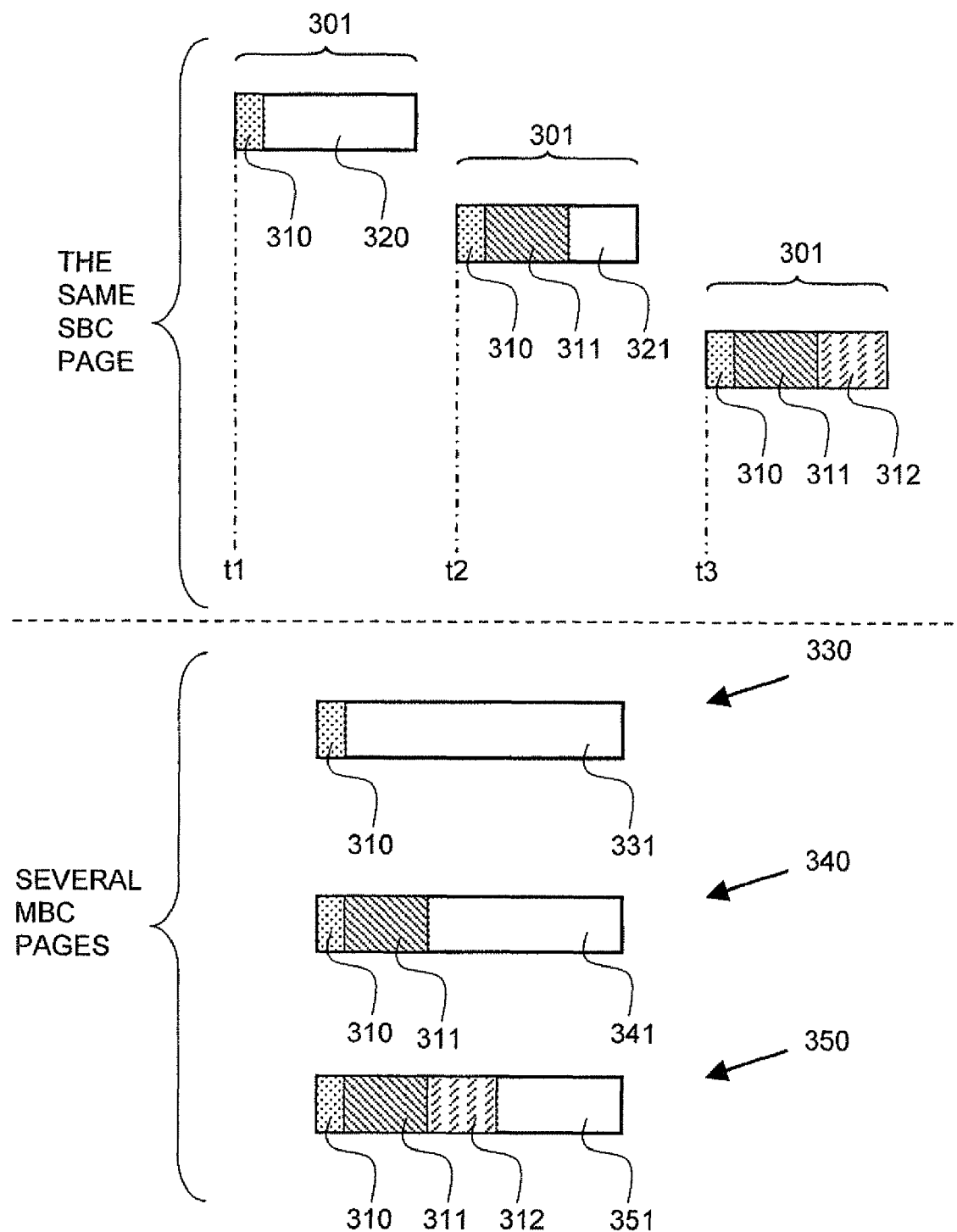
FIG. 3 shows usage of pseudo PPP according to an example embodiment of the present disclosure.

FIG. 3 shows an exemplary emulation of partial page programming ("PPP"), a feature used by SBC flash memory devices, according to the present disclosure. If host device 101 (which, according to one example, is an SBC device) wants to use PPP, it can use it normally, and flash memory device 102 will respond to the resulting "write" instructions issued by the host device by using a pseudo-PPP scheme, as described below. In general, a pseudo-PPP scheme involves writing various data elements in a single physical MCB page in the MCB flash memory device if the host device wants to write these data elements in one logical SBC page.

FIG. 3 will be described in association with FIG. 1. For the sake of simplicity it will be assumed that host device 101 is an SBC device (i.e., it handles data grouped into SBC pages) and flash memory device 102 is an MBC device. Host device 101 sends SBC data (designated as 310, 311, and 312) to flash memory device 102, one data element at a time. Because SBC host devices can use partial page programming (PPP), FIG. 3 illustrates how MBC flash memory device 102 can handle PPP even though conventional MBC flash memory devices are not designed to deal with such operations.

In order for host device 101 to send SBC data 310 to MBC flash memory device 102, host device 101 writes exemplary SBC data 310 into an SBC page whose logical address is 301, and, at time t1, sends SBC page 301 to flash memory device 102 embedded in a corresponding "write" command sequence. Storage space 320 within data page 301 is free of data or empty, and, in SBC storage devices additional data can separately be written into page 301 without erasing data 310, for which reason writing data into page 301 in the way described herein is called "partial page programming". MBC flash memory device 102 receives data 310, through host interface 105, and has several options to write data 310 into MBC cell array 130 to complete the write command issued by host device 101. One option involves using data aggregator 120 to aggregate data 310 with complimentary data, to thereby create a data structure (i.e., device data) that can be written into an MBC page of memory cell array 130. According to this option, and as already discussed above, the complementary data can be other host data that are yet to be received in flash memory device 102, or host data queued in flash memory device 102, or data that is already stored in memory cell array 130. The second option, which will be elaborated below, is to handle data 310 by flash memory device 102 in a way that resembles PPP (the resembling PPP operation being herein referred to as "pseudo-PPP"). To implement the pseudo-PPP option, data 310 can be stored in MBC page 330 while leaving storage space 331 empty, or data aggregator 120 can aggregate data 310 with dummy data to create MBC data and write the created MBC data in memory cell array 130.

At time t2 SBC host device 101 writes data 311 into the free space 320 of logical page 301 and sends page 301 to flash memory device 102 for storage. Writing data 311 into page 301 results in smaller free space (shown at 321) in page 301. Because, in some MBC flash memory devices, physical pages can be written into only once without erasing them first, data 311 cannot be written into physical page 330 within memory cell array 130 even though physical page 330 still has a free space (i.e., space 331). That is, according to the example shown in FIG. 3, the flash memory device is compelled to write currently received data in a new free MBC physical page within memory cell array 130. However, to act in a way that resembles PPP operation, data parser 140 extracts data 310 from physical page 330 and data aggregator 120 aggregates it with (i.e., appends it to) the currently received data 311. Then, data aggregator 120 writes data 310 and the appended data 311 into a new free physical page 340 within memory cell array 130. Likewise, when host device 101 sends, at time t3, to flash memory device 102 data 312, data 312 cannot be written into physical page 340 even though physical page 340 still has an adequate free space (i.e., space 341). Instead, data parser 140 extracts data 310 and data 311 from physical page 340, and data aggregator 120 aggregates data 310 and data 311 with (i.e., appends it to) the received data 312. Then, data aggregator 120 writes data 310, data 311, and the new appended data 312 into a new free MBC physical page 350 within memory cell array 130. As an alternative mode of operation, data 310, 311, and 312, may be written into physical pages 330, 340, and 350, respectively, and then data aggregator 120 can aggregate and write them all in a new free physical page within memory cell array 130. Physical MCB pages 330, 340, and 350, are physically adjacent one another, because, according to the example of FIG. 3, MCB pages are written to successively.

If a host device, such as host device 101, uses partial programming (i.e., PPP) to write individual data elements similar to data 310, 311 and 312, into a logical page similar to logical page 301, it may do so as if the involved flash memory device (e.g., flash memory device 102) were an SBC flash memory device. The involved flash memory device would then respond to the host's issued write instructions by using the pseudo-PPP scheme described above to write the individual host device data elements into the same physical MBC page (in this example into MBC page 350). It is noted that host device 101 is unaware of the pseudo-PPP scheme and, as far as host device 101 is concerned, flash memory device 102 has written data elements 310, 311, and 312, in one physical SBC page.

Controller 103 maintains translation tables 154 for translating logical addresses of SBC pages, which arrive from host device 101, into physical addresses of MBC pages (i.e., device pages) within memory cell array 130. By using translation tables 154 controller 103 keeps track of the physical addresses of the device pages within memory cell array 130, which are used for storing data, and updates translation tables 154 every time data parser 140 extracts data from, and data aggregator 120 writes data into, memory cell array 130. In addition, controller 103 may occasionally need to rearrange or relocate device data, in whole or in part, temporarily or permanently, in memory cell array 130, either immediately upon receiving a memory command from the host device or responsive to such commands. In doing so, controller 103 updates translation tables 154 with the temporary and final logical and physical addresses that are involved in the rearranging and relocation of the data, or portions thereof. Handling translation tables per se in the context of flash memory management is well known in the art and, therefore, is not elaborated herein.

Inter-Page Dependency, P/E Cycles and Reliability

In flash memories the more bits each flash cell can store, the more operation problems there are, which need to be resolved in order to render the flash cells useful. Although MBC flash memories and SBC flash memories will be referenced below, the same principle applies to MBC devices that store two bits per cell, and to MBC devices that store more than two bits per cell.

Regarding inter-page dependency, MBC flash memories are prone to fatal data write/read errors during power failures. In part, this is due to the physical closeness between two pages. SBC flash memories, on the other hand, are less prone to such errors. Therefore, unlike SBC host devices, MBC host devices need to take special precautions to cope with power failures. Therefore, if an SBC host device sends host data in the form of consecutive host pages, the data aggregator writes the host pages into a special sequence of physical device pages (which usually are not adjacent) such that the effect of power failures will be minimized. In other words, the consecutively received host pages are stored in the device pages, not necessarily in consecutive device page order. Sometimes (i.e., depending on the type of data sent by the host device), it will be required to internally backup at least a potion of the data as an additional measure to cope with power failures.

Regarding Programming/Erasing (PIE) cycles and reliability, the maximum number of successful P/E cycles in MBC flash memories is much lower than in SBC flash memories, and their reliability is detrimentally affected by the lower number of P/E cycles. Some SBC host devices use moderate, or less strict, flash management algorithms because it is assumed that SBC devices offer a higher P/E limit and better reliability, which is true for many types of SBC flash memories. Therefore, control circuitry 150 causes host data to be transferred to device pages in memory cell array 130 in such a way that the result will be increased number of P/E cycles as exported to the SBC host device. In other words, by using information that is held in translation tables 154, control circuitry 150 identifies how many P/E cycles each device page has experienced, and then control circuitry 150 causes data aggregator 120 to write host data into less worn-out device pages. Otherwise (if the precaution step described above is not exercised by controller 103), the data, which the SBC host device may later want to read, will be corrupted much sooner than expected in, so called, "standard" SLC flash memories. By "sooner" is meant in less P/E cycles.

Reliability of flash memory devices depends on other factors than P/E cycles. For example, it depends on the number of errors and on the flash cells' ability to retain data. In order to meet the reliability expected by the host device, the control circuitry 150 may have to use one or more internal parameters (i.e., parameters associated with the functioning of device pages) to relocate device data within the memory cell array 130.

To facilitate the precaution measures described above (i.e., writing the individual host data into a special sequence of physical device pages, transferring host data to device pages, and relocation of device data within device pages), the data aggregator employs corresponding mapping algorithms and updates the translation tables 154 with the involved logical and physical addresses, as well as with information that is related to the data locations, which information is associated with the various performance aspects discussed above.

In the description and claims of the present application, each of the verbs, "comprise", "include" and "have", and conjugates thereof, are used to indicate that the object or objects of the verb are not necessarily a complete listing of members, components, elements, or parts of the subject or subjects of the verb.

The articles "a" and "an" are used herein to refer to one or to more than one (i.e., to at least one) of the grammatical object of the article, depending on the context. By way of example, depending on the context, "an element" can mean one element or more than one element.

The term "including" is used herein to mean, and is used interchangeably with, the phrase "including but not limited to".

The terms "or" and "and" are used herein to mean, and are used interchangeably with, the term "and/or," unless context clearly indicates otherwise.

The term "such as" is used herein to mean, and is used interchangeably, with the phrase "such as but not limited to".

Having thus described exemplary embodiments of the invention, it will be apparent to those skilled in the art that modifications of the disclosed example embodiments will be within the scope of the invention. For example, the host device does not necessarily have to be an SBC host device, as the present disclosure is likewise applicable, mutatis mutandis, to other types of host devices and to other types of NAND flash devices Accordingly, additional alternations, modifications, and improvements of the disclosed invention, though not expressly described above, are nonetheless intended and implied to be within the spirit and scope of the invention.

What is claimed is:

1. A method of writing host data into a flash memory device, the method comprising:

a) receiving, by a controller of a flash memory device, from a host device a write instruction to write host data into an array of NAND flash memory cells grouped into separately-writable device pages;

b) aggregating, by the controller, the host data with complementary data to thereby create device data that is storable in one or more of the device pages; and c) writing, by the controller, the device data into the one or more of the device pages, wherein the host data are written by the controller into the flash memory cell array using a pseudo partial page programming (PPP) scheme responsive to the host device using a partial page programming scheme, wherein pseudo PPP extracts data from a separately-writable device page and aggregates it with currently received data to write a new separately-writable device page.

2. The method according to claim 1, wherein the complementary data is other host data received from the host device and queued in the flash memory device.

3. The method according to claim 1, wherein the complementary data is host data already stored in the array of NAND flash memory cells as a portion of other device data and parsed therefrom.

4. The method according to claim 1, wherein the device pages are grouped into blocks and logically-wise written to successively within each block such that their physical addresses are not necessarily sequential.

5. The method according to claim 1, wherein using the pseudo partial page programming scheme by the controller includes using dummy data as the complementary data.

6. The method according to claim 1, wherein the host data are written by the controller in a device page that is not adjacent to an already written-to device page.

7. A controller for a flash memory device, the controller comprising:

a) a host NAND interface adapted to receive host data from a host device;

b) a data aggregator adapted to aggregate the host data with complementary data, thereby creating a device data, and to write the device data into a device page of an array of NAND flash memory cells associated with the flash memory device; and c) control circuitry adapted to write the host data into the flash memory cell array using a pseudo PPP scheme responsive to the host device writing host data using a partial page programming scheme, wherein pseudo PPP extracts data from a separately-writable device page and aggregates it with currently received data to write a new separately-writable device page.

8. The controller according to claim 7, wherein the complementary data is other host data received from the host device and queued in the flash memory device for storing in the array of NAND flash memory cells.

9. The controller according to claim 7, further comprising:

c) a data parser adapted to parse complementary data from device data.

10. The controller according to claim 9, wherein the complementary data is other host data parsed from device data.

11. The controller according to claim 8, wherein the data parser is further adapted to parse given host data from device data upon receiving, from the host device, a command to read the given host data.

12. The controller according to claim 7, wherein device pages are grouped into device blocks, and wherein the data aggregator is further adapted to logically-wise write data into device pages successively within each block such that their physical addresses are not necessarily sequential.

13. The controller according to claim 7, wherein, upon receiving an instruction from the host device to erase given host data, the given host data is marked by the controller as "erased", and a message is sent to the host device that the given host data has been erased.

14. The controller according to claim 7, wherein, in using the pseudo partial page programming scheme, the control circuitry uses dummy data as the complementary data.

15. The controller according to claim 7, wherein the control circuitry is adapted, upon receiving an instruction from the host device to erase given host data, to mark the given host data as erased and to send a message to the host device that the given host data has been erased.

16. The controller of claim 7, wherein the host data is formatted for an array of memory cells that stores data in M bits per cell, and wherein the memory cell array of the flash memory device stores data in N bits per cell, wherein N and M are integers and N is greater than M.

17. The controller of claim 16, wherein N equals 2 and M equals 1.

18. The controller of claim 16, wherein N equals 4 and M equals 1.

19. The controller of claim 16, wherein N equals 4 and M equals 2.

* * * * *